United States Patent
Maurech et al.

(10) Patent No.: US 11,032,903 B2
(45) Date of Patent: Jun. 8, 2021

(54) SUPPORT FOR SHAPING A FLEXIBLE PORTION OF A FLEXIBLE PRINTED CIRCUIT BOARD

(71) Applicant: SAGEMCOM BROADBAND SAS, Rueil-Malmaison (FR)

(72) Inventors: Cécile Maurech, Rueil Malmaison (FR); Yann Le Henanff, Rueil Malmaison (FR)

(73) Assignee: Sagemcom Broadband SAS, Rueil Malmaison (FR)

(*) Notice: Subject to any disclaimer, the term of this patent is extended or adjusted under 35 U.S.C. 154(b) by 0 days.

(21) Appl. No.: 16/765,230

(22) PCT Filed: Nov. 14, 2018

(86) PCT No.: PCT/EP2018/081233
§ 371 (c)(1),
(2) Date: May 19, 2020

(87) PCT Pub. No.: WO2019/115123
PCT Pub. Date: Jun. 20, 2019

(65) Prior Publication Data
US 2020/0281072 A1 Sep. 3, 2020

(30) Foreign Application Priority Data

Dec. 15, 2017 (FR) .................... 17 62292

(51) Int. Cl.
*H05K 1/02* (2006.01)
*H05K 3/36* (2006.01)
*H05K 7/14* (2006.01)

(52) U.S. Cl.
CPC .......... *H05K 1/0278* (2013.01); *H05K 3/361* (2013.01); *H05K 7/1417* (2013.01); *H05K 2201/046* (2013.01)

(58) Field of Classification Search
CPC .. H05K 1/0277; H05K 1/0278; H05K 3/0014; H05K 2201/056; H05K 2201/051; H05K 2201/057; H05K 2201/066
See application file for complete search history.

(56) References Cited

U.S. PATENT DOCUMENTS

| 2015/0282304 A1 | 10/2015 | Ely et al. |
| 2017/0184661 A1* | 6/2017 | Dangy-Caye ........... H04M 1/24 |
| 2020/0133047 A1* | 4/2020 | Isobe .................... G02F 1/1345 |

FOREIGN PATENT DOCUMENTS

| JP | 2001-355664 A | 12/2001 |
| JP | 2011-181621 A | 9/2011 |

* cited by examiner

*Primary Examiner* — Jeremy C Norris
(74) *Attorney, Agent, or Firm* — Muncy, Geissler, Olds and Lowe, P.C.

(57) ABSTRACT

The invention relates to a support for shaping a flexible portion (5) of a flexible printed circuit board (1), to be positioned between an outer corner (10) of a base such as a heat spreader (2) and the flexible portion when the flexible printed circuit board is fixed to the base and the flexible portion extends around the outer corner of the base, comprising a body having at least one first bearing surface (14) and at least one second bearing surface (15), the first bearing surface having the form of an angular cylinder portion, the second bearing surface being arranged so as to press against a complementary surface (17) of the outer corner of the base. The shaping support is arranged so as to ensure that the flexible portion of the flexible printed circuit board presses against the first bearing surface when the shaping support is mounted against the base and that the flexible printed circuit board is fixed to the base.

14 Claims, 3 Drawing Sheets

SUPPORT FOR SHAPING A FLEXIBLE PORTION OF A FLEXIBLE PRINTED CIRCUIT BOARD

The invention relates to the field of formers for shaping a flexible portion of a flexible printed circuit.

BACKGROUND OF THE INVENTION

Numerous pieces of electrical equipment include one or more printed circuits that are said to be "flexible".

A flexible printed circuit presents a particularly advantageous solution for the purpose of making electrical connections between two portions of a single piece of electrical equipment that are movable or angled relative to each other, for the purpose of incorporating electronic functions in a piece of electrical equipment that is to be twisted or folded, or indeed for the purpose of optimizing the integration of electronic functions in a small volume.

Proposals have thus been made to fasten a flexible printed circuit on a heatsink of the finned heatsink type. The flexible printed circuit and the heatsink are then integrated in a piece of electrical equipment, e.g. in a residential gateway in the shape of a tower.

The flexible printed circuit comprises a first portion, a second portion, and a flexible portion joining together the first and second portions. The first portion is positioned against a first side face of the heatsink. The second portion is positioned against a second side face of the heatsink. The first side face and the second side face are adjacent. The flexible portion then extends around an outside corner of the heatsink defined by the junction between the first side face and the second side face.

This serves to optimize integration of the flexible printed circuit and the heatsink in the piece of electrical equipment.

In order to implement such an application, proposals have been made to use a flexible printed circuit manufactured using so-called "flex" technology, or else using so-called "flex-rigid" technology, or indeed using technology derived from both of those technologies. In "flex" technology, the substrate of the entire flexible printed circuit is made out of a flexible material, e.g. out of polyether ether ketone (PEEK) or out of polyester. In "flex-rigid" technology, only a portion of the flexible printed circuit is flexible.

In both situations, a material is used that is very flexible, such that while it is being integrated, it takes up the curvature defined by its position on the heatsink.

There are two main obstacles to using that solution.

A first obstacle relates to the cost of the solution. So-called "flex" and "flex-rigid" technologies are technologies that are very expensive.

A second obstacle relates to the proximity between the flexible portions of the flexible printed circuit and the metal masses of the heatsink. The flexible portion is likely to be conveying electrical signals at high frequency. Particular attention needs to be given to the routing of such electrical signals. In particular, the characteristic impedance of the tracks conveying those electrical signals must be well-controlled. Unfortunately, that characteristic impedance depends strongly on any metal masses situated in the proximity of the flexible portion (within a distance of a few millimeters). It is impossible to protect those electrical signals within the flexible portion itself, since the flexible portion has fewer routing layers than do the first portion or the second portion.

It is therefore appropriate to guarantee that the flexible portion and the heatsink are spaced apart sufficiently and in controlled manner, which is complicated to achieve.

In order to overcome those obstacles, proposals have been made to form the printed circuit directly on the heatsink. Nevertheless, the usual method of manufacturing heatsinks by die casting aluminum does not present manufacturing tolerances that are compatible with the accuracy required for shaping the flexible portion of a printed circuit.

OBJECT OF THE INVENTION

An object of the invention is to integrate a flexible printed circuit on a mount, such as a heatsink, while overcoming the above-mentioned obstacles.

SUMMARY OF THE INVENTION

In order to achieve this object, there is provided a former for shaping a flexible portion of a flexible printed circuit, the former being for positioning between an outside corner of a mount such as a heatsink and the flexible portion of a flexible printed circuit when the flexible printed circuit is fastened on the mount and its flexible portion extends around the outside corner of the mount, the former having at least one first bearing surface and at least one second bearing surface, the first bearing surface having the shape of an angular portion of a cylinder, the second bearing surface being arranged to come to bear against a complementary surface of the outside surface of the mount, the former being arranged to ensure that the flexible portion of the flexible printed circuit comes to bear against the first bearing surface when the former is mounted against the mount and the flexible printed circuit is fastened on the mount.

The former of the invention serves to ensure some minimum amount of spacing between the flexible printed circuit and the mount, e.g. spacing equal to at least 1 millimeter (mm). This ensures that the flexible portion of the flexible printed circuit is properly curved around the cylindrical angular portion of the first bearing surface. Thus, the flexible portion is neither stressed nor weakened when the flexible printed circuit is fastened on the mount. It is thus possible to make use of a flexible printed circuit that makes use of a solution that is less expensive than a solution of the "flex" type or of the "flex-rigid" type, and for example it is possible to use a flexible printed circuit in which the flexible portion is made to be flexible by local machining that consists in cutting away or compressing zones of the flexible portion.

There is also provided a device comprising a former of the kind described above, a flexible printed circuit, and a mount, the flexible printed circuit comprising a first portion fastened to a first side face of the mount, a second portion fastened to a second side face of the mount, and the flexible portion, which flexible portion extends around the outside corner of the mount.

There is also provided electrical equipment comprising a housing having integrated therein a device of the kind described above.

Other characteristics and advantages of the invention appear on reading the following description of particular, nonlimiting embodiments of the invention.

BRIEF DESCRIPTION OF THE DRAWINGS

Reference is made to the accompanying drawings, in which.

DETAILED DESCRIPTION OF THE INVENTION

In this example, the invention is implemented in a residential gateway in the form of a "tower".

Figure 1:
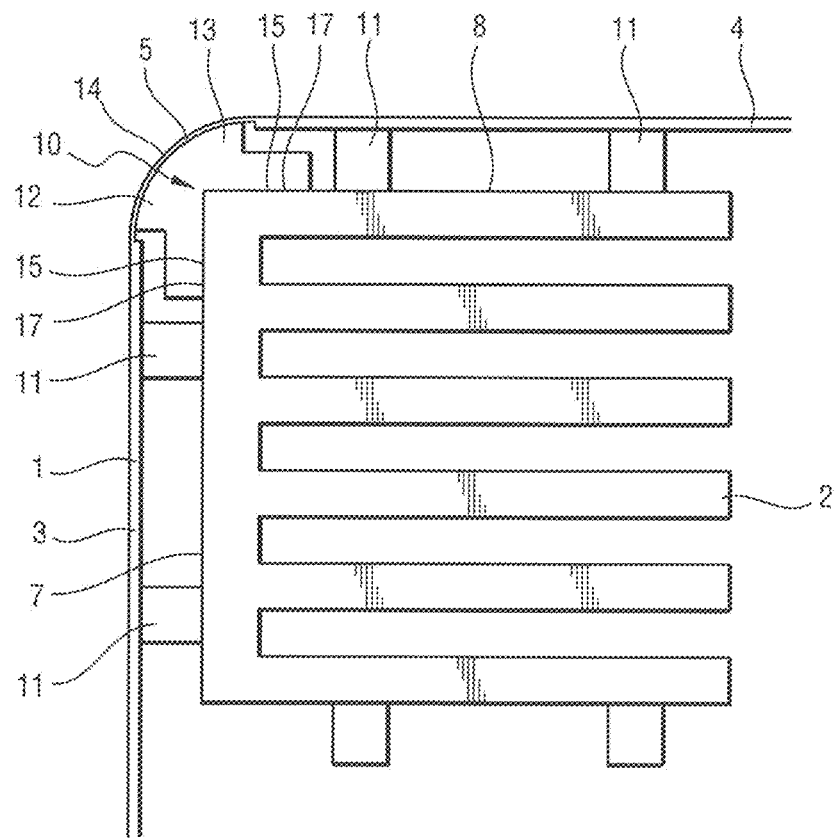
FIG. 1 shows a flexible printed circuit, a heatsink, and a former in a first embodiment of the invention.

With reference to FIG. 1, a flexible printed circuit 1 is fastened on a heatsink 2 for the purposes of integration as mentioned above. Thereafter, the flexible printed circuit 1 and the heatsink 2 are integrated in a housing of the residential gateway.

The heatsink 2 is used to dissipate heat produced by electrical components mounted on the flexible printed circuit 1.

The flexible printed circuit 1 has a substrate made of fiberglass.

The flexible printed circuit 1 comprises a first portion 3 of the flexible printed circuit, a second portion 4 of the flexible printed circuit, and a flexible portion 5.

In this example, the first portion 3 and the second portion of 4 are rigid portions. The flexible portion 5 is made flexible by local machining that consists in cutting away or compressing zones of the flexible portion 5. This local machining is performed when the flexible printed circuit 1 is manufactured, prior to it being fastened on the heatsink 2.

The flexible portion 5 provides a junction between the first portion 3 and the second portion 4.

The flexible portion 5 is a portion having at least one layer of electrical signals associated with a substrate. Specifically in this example the flexible portion 5 has two layers of electrical signals associated with corresponding substrates.

While the flexible printed circuit 1 is being manufactured, additional layers, and specifically two additional layers, are pressed against the first portion 3 and the second portion 4. In this example, the two additional layers are two electrical signal layers. Thus, in this example, the first portion 3 and the second portion 4 have four layers.

It should be observed that the flexible portion 5 could also be obtained by locally machining at least one electrical signal layer and the corresponding substrates so as to provide flexibility relative to the initial rigid printed circuit used for manufacturing the flexible printed circuit 1.

The heatsink 2 is a finned heatsink. The heatsink 2 has a first side face 7 and a second side face 8 perpendicular to the first side face 7. An outside corner 10 of the heatsink 2 is defined at the intersection between the first side face 7 and the second side face 8. It should be understood that it is perfectly possible for the first side face 7 and the second side face 8 not to be mutually perpendicular, and for them to be oriented relative to each other at any angle.

Metal projections, in the form of studs 11, extend from the first side face 7 and from the second side face 8.

The first portion 3 of the flexible printed circuit 1 is to be fastened on the studs 11 of the first side face 7. The second portion 4 of the flexible printed circuit 1 is to be fastened on the studs 11 of the second side face 8.

The first portion 3 and the second portion 4 may be fastened to the first side face 7 and to the second side face 8 with fastening means of any type, and in particular with fastening means other than projections, and with fastening means made of metal or otherwise. For example, plastics spacers could be used.

Figure 2:
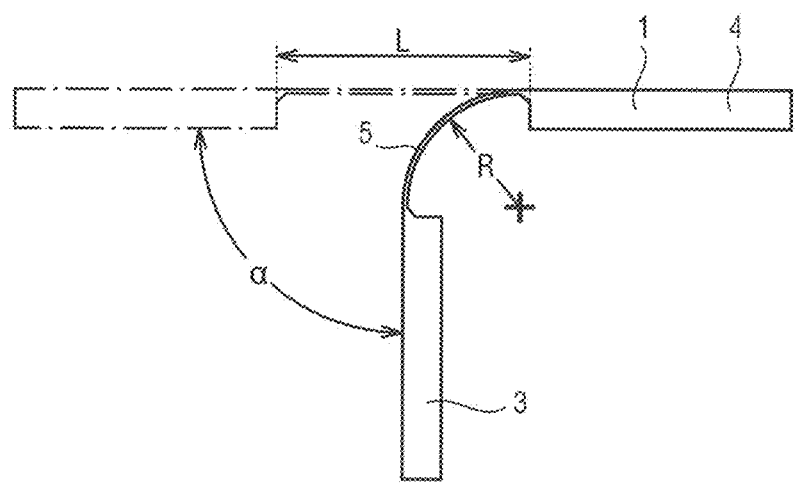
FIG. 2 shows the principle of bending the flexible printed circuit.

With reference to FIG. 2, when the flexible printed circuit 1 is being fastened on the heatsink 2, its flexible portion 5 is bent over a length L, through a bending angle α, so as to obtain a radius of curvature R. Bending is made possible and facilitated by the local machining of the flexible printed circuit 1.

In order to fasten the flexible printed circuit 1 to the heatsink 2, use is made of a former 12 constituting a first embodiment of the invention.

The former 12 comprises a body 13 having at least a first bearing surface and at least a second bearing surface. The first bearing surface(s) is/are situated on a first side of the body 13, while the second bearing surface(s) is/are situated on a second side of the body 13, the second side being situated opposite from the first side.

Specifically in this example, the body 13 has a single first bearing surface 14 and two second bearing surfaces 15.

The first bearing surface 14 is in the shape of an angular portion of a cylinder. The two second bearing surfaces 15 are plane and mutually perpendicular.

In this example, the body 13 of the former 12 is made out of rigid, non-conductive material, e.g. a thermoplastic material or a ceramic material, or out of any other non-conductive material.

The body 13 is manufactured to within a first manufacturing tolerance that is less than a first predetermined tolerance threshold. In this example, the first predetermined tolerance threshold is equal to 0.3 mm. The body 13 thus presents shape tolerance that is very accurate. The first predetermined tolerance threshold could be different. The first predetermined tolerance threshold is defined as a function of the tolerance acceptable by the flexible printed circuit 1 in order to avoid it deteriorating.

The two second bearing surfaces 15 of the body 13 of the former 12 are to bear against two complementary surfaces 17 of the heatsink 2. The two complementary surfaces 17 are plane and mutually perpendicular. The two complementary surfaces 17 are portions of the first side face 7 and of the second side face 8 of the heatsink 2. The two complementary surfaces 17 meet to form the outside corner 10 of the heatsink 2.

It should be observed that the two second bearing surfaces 15 do not necessarily need to be plane, nor do they need to be mutually perpendicular. The two second bearing surfaces 15 are designed to take up positions on the two complementary surfaces 17 of the heatsink 2, which complementary surfaces are not necessarily plane and mutually perpendicular. Thus, the two second bearing surfaces 15 are plane and mutually perpendicular only if the two complementary surfaces 17 of the heatsink 2 are likewise plane and mutually perpendicular.

The two complementary surfaces 17 of the heatsink 2 are machined very accurately, so that the two complementary surfaces 17 are manufactured with a second manufacturing tolerance of that is less than a second predetermined tolerance threshold. In this example, the second predetermined tolerance threshold is equal to 0.1 mm. At its outside corner 10, the heatsink 2 thus presents shape tolerance that is very accurate. The second predetermined tolerance threshold could be different. The second predetermined tolerance threshold is defined in such a manner that the sum of the tolerances, i.e. the sum of the first predetermined tolerance threshold plus the second predetermined tolerance threshold, makes it possible to guarantee the integrity of the flexible printed circuit 1.

Thus, while the flexible printed circuit 1 is being fastened on the heatsink 2, the former 12 is initially fastened to the outside corner 10 of the heatsink 2 by using any appropriate fastener means: screws, staking, adhesive, snap fastening, etc.

Thereafter, the first rigid portion 3 of the flexible printed circuit 1 is fastened on the studs 11 of the first side face 7 of the heatsink 2.

Thereafter, the flexible portion 5 is shaped around the first bearing surface 14 in the form of an angular portion of a cylinder on the body 13 of the former 12.

The second portion 4 of the flexible printed circuit 1 is then fastened on the studs 11 of the second side face 8 of the heatsink 2.

The first manufacturing tolerance of the body 13 of the former 12 and the second manufacturing tolerance of the complementary surfaces 17 of the outside corner 10 of the heatsink 2 make it possible to ensure that the flexible portion 5 comes to bear against the entirety of the first bearing surface 14 of the body 13. The first manufacturing tolerance and the second manufacturing tolerance also make it possible to ensure that the entirety of the second bearing surfaces 15 of the body 13 of the former 12 come to bear against the complementary surfaces 17. In particular, the outside corner 10 of the heatsink 2 is accurately engaged in an inside corner of the former 12 situated at the intersection between the two second bearing surfaces 15.

This guarantees accurate shaping, thereby ensuring that the flexible portion 5 of the flexible printed circuit 1 adopts a shape that is accurately cylindrical. This ensures that there is spacing of at least 1 mm between the heatsink 2 and every point of the flexible portion 5 that conveys a high-frequency electrical signal (or any other sensitive electrical signal). The high-frequency electrical signals are thus not disturbed by the metal portions of the heatsink 2.

Figure 3:
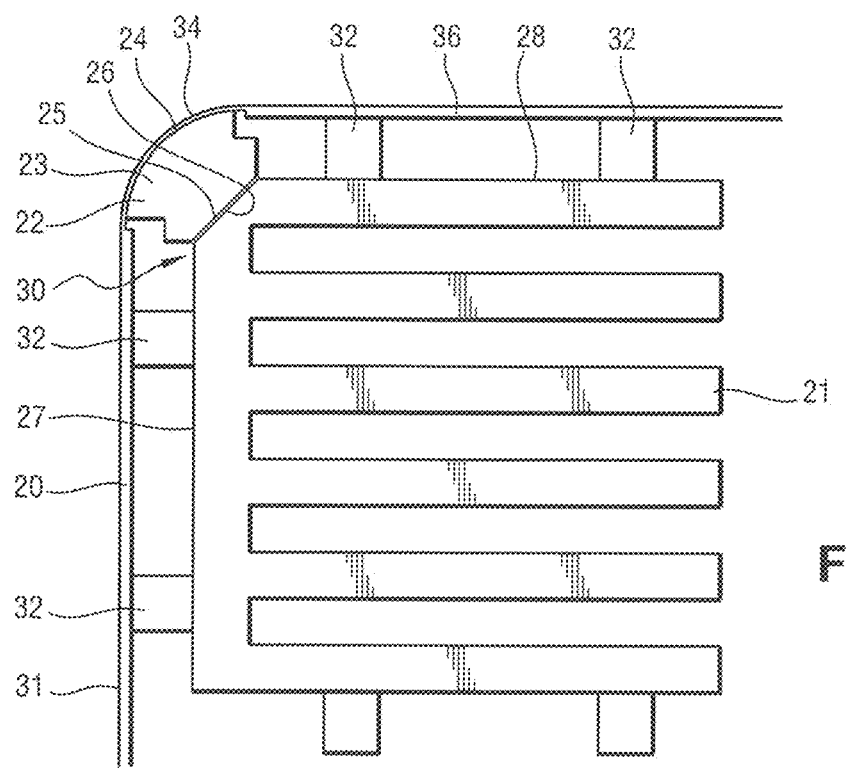
FIG. 3 shows a flexible printed circuit, a heatsink, and a former in a second embodiment of the invention.

With reference to FIG. 3, in order to fasten the flexible printed circuit 20 on the heatsink 21, use is made alternatively of a former 22 constituting a second embodiment of the invention.

The former 22 comprises a body 23 having a first bearing surface 24 and at least one second bearing surface 25. Once more, the first bearing surface 24 and the second bearing surface 25 are situated on two opposite sides of the former 22.

The first bearing surface 24 is in the shape of an angular portion of a cylinder. The second bearing surface 25 is plane.

In this example, the body 23 of the former 22 is made out of a resilient, non-conductive material, e.g. out of silicone or out of rubber. The hardness of the material is adjusted as a function of the thickness of the body 23. In order to evaluate hardness, it is possible to use the Shore A hardness scale, or any other type of hardness scale. On the Shore A hardness scale, the hardness should be selected to lie in the range 40 to 60, and advantageously it should be close to or equal to 50.

The two second bearing surfaces 25 of the body 23 of the former 22 are to bear against a complementary surface 26 of the heatsink 21.

The complementary surface 26 is a plane surface joining together the first side faces 27 and the second side face 28. The complementary surface 26 is oriented at an angle of 45° relative to the first side face 27 and relative to the second side face 28. The complementary surface 26, the first side face 27, and the second side face 28 form a broken angle (or chamfer) at the outside corner 30.

The heatsink 21, and in particular the outside corner 30 and the complementary surface 26, are manufactured with a manufacturing tolerance that is large, in this example greater than 1 mm.

Thus, while the flexible printed circuit 20 is being fastened on the heatsink 21, the former 22 is initially fastened to the outside corner 30 of the heatsink 21 by using any appropriate fastener means: screws, staking, adhesive, snap fastening, etc.

Thereafter, the first portion 31 of the flexible printed circuit 20 is fastened on the studs 32 of the first side face 27 of the heatsink 21.

Thereafter, the flexible portion 34 is shaped around the first bearing surface 24 of the body 23 of the former 22.

The second portion 36 of the flexible printed circuit 20 is then fastened on the studs 32 of the second side face 28 of the heatsink 21.

The former 22, with its body 23 that is resilient, provides backing and serves to compensate for the large manufacturing tolerance of the heatsink 21 and thus for the shape tolerances.

Once more, this guarantees that the flexible portion 34 is shaped accurately and adopts a shape that is cylindrical. This ensures that there is spacing of at least 1 mm between the heatsink 21 and every point of the flexible portion 34 that conveys a high-frequency electrical signal (or any other sensitive electrical signal).

Figure 4:
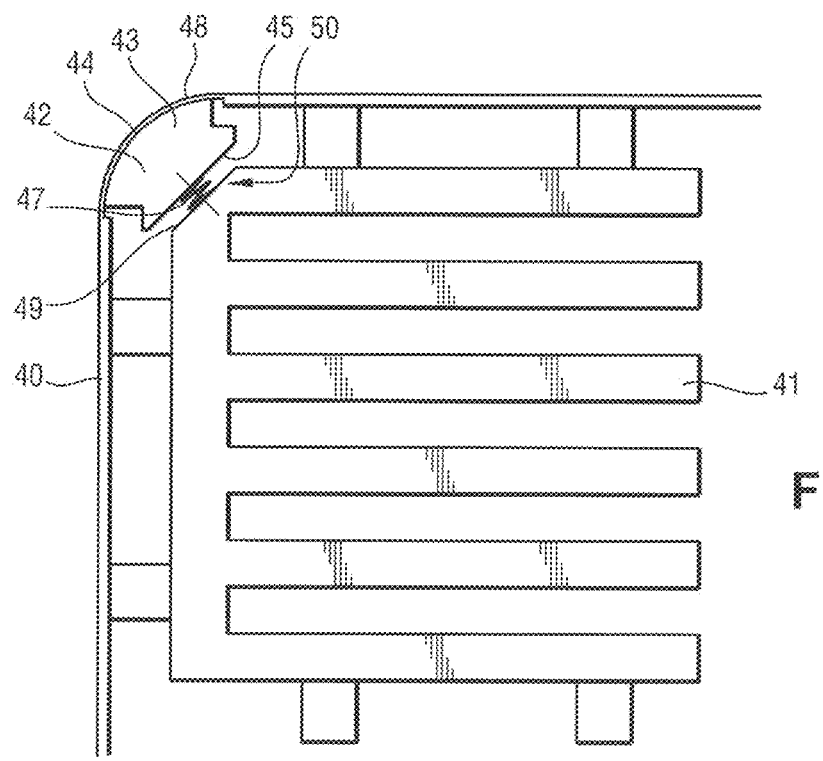
FIG. 4 shows a flexible printed circuit, a heatsink, and a former in a third embodiment of the invention.

With reference to FIG. 4, in order to fasten the flexible printed circuit 40 on the heatsink 41, use is made alternatively of a former 42 constituting a third embodiment of the invention.

The former 42 comprises a body 43 of a shape that is close to the shape of the body 23 of the former 22 in the second embodiment of the invention.

The body 43 thus presents a first bearing surface 44 and a second bearing surface 45. Once more, the first bearing surface 44 and the second bearing surface 45 are situated on two opposite sides of the former 42. The first bearing surface 44 is in the shape of an angular portion of a cylinder. The second bearing surface 45 is plane.

In this example, the body 43 of the former 42 is made out of rigid, non-conductive material, e.g. a thermoplastic material or a ceramic material, or out of any other non-conductive material.

The body 43 is manufactured with a third manufacturing tolerance that is relatively large, and that typically lies in the range 0.5 mm to 0.8 mm.

A resilient member extends from a central zone of the second bearing surface 45 of the body 43 of the former 42.

The resilient member is a spring 47. A first end of the spring 47 is fastened to the second bearing surface 45. It should be observed that the resilient member could comprise a plurality of springs, and/or a plurality of spring blades, and/or any flexible material such as foam.

The backing force from the spring 47 is selected to compensate exactly the bending force exerted by the flexible portion 48 while the flexible printed circuit 40 is being shaped.

The second bearing surface 45 of the body 43 of the former 42, and the second end of the spring 47, are to come to bear against a complementary surface 49 of the heatsink 41.

In this example, the complementary surface 49 is similar to the complementary surface 26.

The heatsink 41, and in particular the outside corner 50 and the complementary surface 49, are manufactured with a manufacturing tolerance that is large, in this example greater than 1 mm.

Thus, while the flexible printed circuit 40 is being fastened on the heatsink 41, the former 42 is initially fastened to the outside corner 50 of the heatsink 41 by using any appropriate fastener means: screws, staking, adhesive, snap fastening, etc.

The spring 47 serves to provide the backing force and to compensate for the large manufacturing tolerances of the heatsink 41 and of the former 42.

Once more, this guarantees that the flexible portion 48 is shaped accurately and adopts a shape that is cylindrical. Once more, this ensures that there is spacing of at least 1 mm between the heatsink 41 and every point of the flexible portion 48 that conveys a high-frequency electrical signal (or any other sensitive electrical signal).

Figure 5:
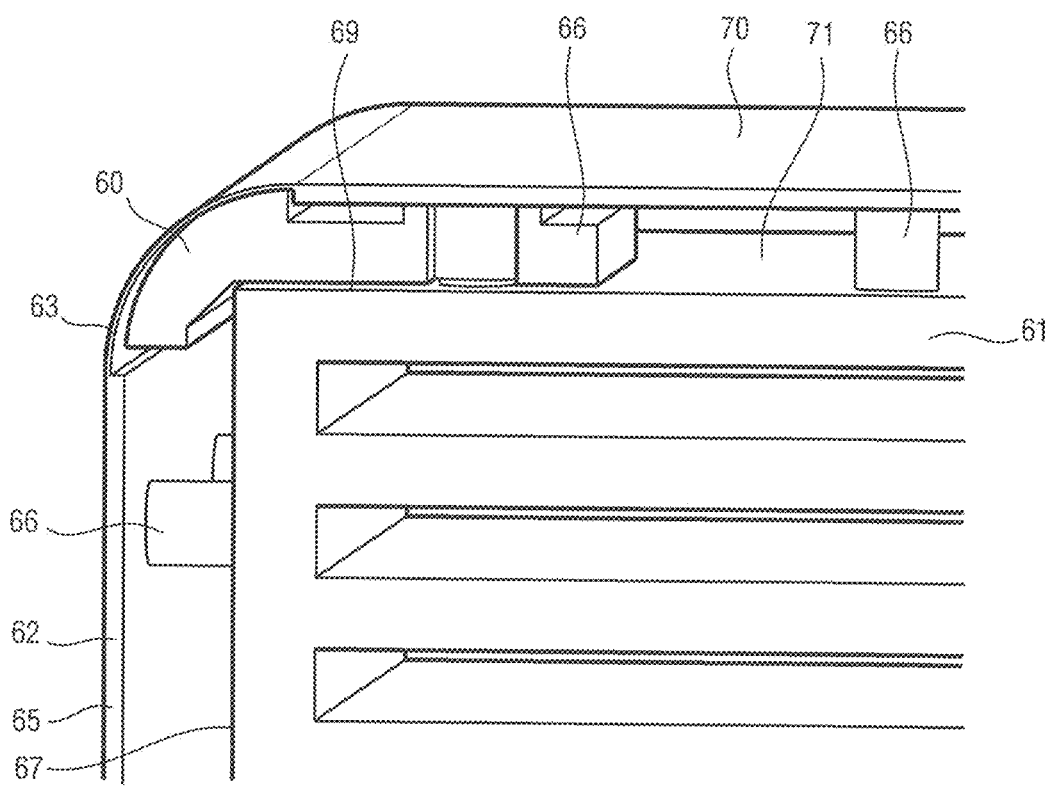
FIG. 5 shows a flexible printed circuit, a heatsink, and a former fastened to the printed circuit.

With reference to FIG. 5, it should be observed that, whatever the embodiment, the former 60 does not necessarily need to be fastened to the heatsink 61. The former 60 could equally well be fastened to the flexible printed circuit 62, prior to bending the flexible portion 63, by using any appropriate fastener means: screws, staking, adhesive, snap fastening, etc.

Thus, while the flexible printed circuit 62 is being fastened on the heatsink 61, the former 60 is fastened initially on the flexible printed circuit 62.

The first portion 65 of the flexible printed circuit 62 is then fastened on the studs 66 of the first side face 67.

Thereafter, the flexible portion 63 is shaped. At the end of bending, the former 60 comes into abutment against a complementary surface 69 of the heatsink 61.

The second portion 70 of the flexible printed circuit 62 is then fastened on the studs 66 of the second side face 71.

Naturally, the invention is not limited to the embodiments described, but covers any variant coming within the ambit of the invention as defined by the claims.

Although certain materials are mentioned out of which the former can be manufactured, it is entirely possible for it to be manufactured out of some other material.

The description above relates to flexible printed circuits, each fastened to a heatsink of a residential gateway. Nevertheless, the invention can be used to fasten a flexible printed circuit to any type of mount manufactured out of any type of material and for the purpose of being integrated in equipment of any type.

The invention claimed is:

1. A former for shaping a flexible portion of a flexible printed circuit, the former being for positioning between the flexible portion and an outside corner of a mount when the flexible printed circuit is fastened on the mount and the flexible portion extends around the outside corner of the mount, the former comprising a body comprising at least one first bearing surface and at least one second bearing surface, the first bearing surface having the shape of an angular portion of a cylinder, the second bearing surface being arranged to come to bear against a complementary surface of the outside surface of the mount, the former being arranged to ensure that the flexible portion of the flexible printed circuit comes to bear against the first bearing surface when the former is mounted against the mount and the flexible printed circuit is fastened on the mount, the mount being a heat sink.

2. The former according to claim 1, wherein the body is made out of a rigid material and is manufactured to within a first manufacturing tolerance that is less than a first predetermined tolerance threshold.

3. The former according to claim 2, wherein the body has two second bearing surfaces suitable for coming to bear against two complementary surfaces of the mount, the two complementary surfaces defining the outside corner of the mount.

4. The former according to claim 1, wherein the body is made out of a resilient material.

5. The former according to claim 4, wherein the resilient material presents hardness lying in the range 40 to 60 on the Shore A scale.

6. The former according to claim 1, wherein the body is made out of a rigid material, the former further including a resilient member that extends from the second bearing surface.

7. The former according to claim 6, wherein the resilient member comprises at least one spring and/or spring blade.

8. A device including a former according to claim 1, a flexible printed circuit, and a mount, the flexible printed circuit comprising a first portion fastened to a first side face of the mount, a second portion fastened to a second side face of the mount, and the flexible portion, which flexible portion extends around the outside corner of the mount.

9. The device according to claim 8, including a former, wherein the outside corner includes at least one complementary surface manufactured by machining to within a second manufacturing tolerance that is smaller than a second predetermined tolerance threshold.

10. The device according to claim 8, including a former, the heatsink having two side faces that meet via the complementary surface, the two side faces and the complementary surface forming a broken angle at the outside corner.

11. The device according to claim 8, the former being fastened to the flexible printed circuit prior to fastening the flexible printed circuit on the mount.

12. The device according to claim 8, wherein the flexible portion of the flexible printed circuit is machined locally in order to make it bendable.

13. Electrical equipment comprising a housing having integrated therein a device according to claim 8.

14. The electrical equipment according to claim 13, the electrical equipment being a residential gateway.

* * * * *